(12) United States Patent
Zhu et al.

(10) Patent No.: US 7,989,891 B2
(45) Date of Patent: Aug. 2, 2011

(54) MOS STRUCTURES WITH REMOTE CONTACTS AND METHODS FOR FABRICATING THE SAME

(75) Inventors: Jianhong Zhu, Austin, TX (US); Jinrong Zhou, Austin, TX (US); David Wu, Austin, TX (US); James F. Buller, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 542 days.

(21) Appl. No.: 11/755,930

(22) Filed: May 31, 2007

(65) Prior Publication Data
US 2008/0296682 A1    Dec. 4, 2008

(51) Int. Cl.
 H01L 29/786    (2006.01)
 H01L 21/336    (2006.01)
(52) U.S. Cl. ...................................................... 257/347
(58) Field of Classification Search .................. 257/347, 257/664–665, 734–786, E21.62, E29.116–E29.122, 257/E29.284, E29.299, 621, 532, 618, 310–311, 257/374, 389, 410, 411, 506–508, 510, 520, 257/524, 632–651, 671, 701–703, 42–47, 257/200–201, 388, 407, 412, 442, 614–616, 257/677, 41, 91, 343, 217, 349–350, 352, 257/351, 353, 354; 438/38, 211, 216, 221, 438/225, 240, 257, 261, 263, 264, 287, 294–307, 438/765, 794, 967, 981, 85, 104, 575, 580, 582, 602, 606, 610, 612–617, 622–688
See application file for complete search history.

(56) References Cited

U.S. PATENT DOCUMENTS

| | | | |
|---|---|---|---|
| 6,141,255 A | 10/2000 | Sunkavalli | |
| 6,486,515 B2 * | 11/2002 | Jun et al. | 257/360 |
| 7,285,477 B1 | 10/2007 | Bernstein et al. | 438/455 |
| 2006/0228862 A1 * | 10/2006 | Anderson et al. | 438/279 |
| 2007/0210385 A1 * | 9/2007 | Ker et al. | 257/356 |
| 2007/0235823 A1 | 10/2007 | Hsu et al. | 257/411 |
| 2008/0197411 A1 * | 8/2008 | Korec et al. | 257/343 |

* cited by examiner

*Primary Examiner* — Dao H Nguyen
*Assistant Examiner* — Tram H Nguyen
(74) *Attorney, Agent, or Firm* — Ingrassia Fisher & Lorenz, P.C.

(57) ABSTRACT

MOS structures with remote contacts and methods for fabricating such MOS structures are provided. In one embodiment, a method for fabricating an MOS structure comprises providing a semiconductor layer that is at least partially surrounded by an isolation region and that has an impurity-doped first portion. First and second MOS transistors are formed on and within the first portion. The transistors are substantially parallel and define a space therebetween. An insulating material is deposited overlying the first portion of the semiconductor layer and at least a portion of the isolation region. A contact is formed through the insulating material outside the space such that the contact is in electrical communication with the transistors.

18 Claims, 14 Drawing Sheets

MOS STRUCTURES WITH REMOTE CONTACTS AND METHODS FOR FABRICATING THE SAME

FIELD OF THE INVENTION

The present invention generally relates to MOS structures and methods for fabricating MOS structures, and more particularly relates to MOS structures with remote conductive contacts and methods for fabricating such MOS structures.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode.

The MOS transistor is accessed via a conductive contact typically formed on the source/drain regions between the gate electrodes of two MOS transistors. The conductive contact is usually formed by depositing an insulating layer over a metal silicide on the source/drain regions and etching a contact opening in the insulating layer. A thin barrier layer, typically of titanium and/or titanium nitride, is deposited in the contact opening and the opening then is filled by a chemical vapor deposited layer of tungsten.

However, present-day contact manufacturing techniques create challenges to advanced MOS technology. For example, there is a continuing trend to incorporate more and more circuitry on a single IC chip. To incorporate the increasing amount of circuitry, the size of each individual device in the circuit and the size and spacing between device elements must decrease. However, one of the limiting factors in the continued shrinking of integrated semiconductor devices is the resistance of contacts to doped regions such as the source and drain regions of an MOS transistor. As the width of the contact decreases, the resistance of the contact becomes increasingly larger. In turn, as the resistance of the contact increases, the drive current of the device decreases, thus adversely affecting device performance.

In addition, conventional contacts raise challenges with respect to isolation of the contacts from the gate electrodes. To overcome an increase in resistance, designers often do not scale a contact to the degree that other features in a device are scaled. A larger contact formed between a smaller space between gate electrodes results in a thinner dielectric between the contact and at least one of the gate electrodes. In addition, as the overall device is decreased in size, it becomes more difficult to etch a contact opening within the smaller space between the gate electrodes. Often, the contact openings are not etched vertically but are etched inadvertently at a slight angle. In addition, misaligned mask overlays cause an overlay shift that may result in the etching of the contact opening closer to one of the gate electrodes. These deviations from the etching specifications can result in a thinner dielectric layer between the contact and the gate electrode. The thinner dielectric layer between the contact and a gate electrode can result in current leakage between the contact and the gate electrode. The smaller distance between the contact and a gate electrode also can result in a larger capacitance therebetween.

Still further, conventional contacts adversely affect the benefits of stress layers often formed on MOS transistors. MOS transistors, in contrast to bipolar transistor, are majority carrier devices. The mobility of holes, the majority carrier in a P-channel MOS transistor, can be increased by applying a compressive longitudinal stress to the channel. Alternatively, the mobility of electrons, the majority carrier in an N-channel MOS transistor, can be increased by applying a tensile longitudinal stress to the channel. These stresses are typically applied to the channels by forming a stressed layer over the MOS transistor device, including the source and drain regions and the gate electrode. However, the contact usually is formed through the stress layer, thus requiring a hole to be etched through the stress layer. The hole reduces the effect of the stress layer, thus compromising device performance.

Accordingly, it is desirable to provide MOS structures with contacts formed remote from gate electrodes. It is also desirable to provide methods for fabricating such MOS structures. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating an MOS structure in accordance with an exemplary embodiment of the invention is provided. The method comprises providing a semiconductor layer at least partially surrounded by an isolation region and having a first portion. A first gate stack and a second gate stack are formed on the first portion of the semiconductor layer. The first gate stack and the second gate stack are substantially parallel and define a space therebetween. An insulating material is deposited overlying the first portion of the semiconductor layer and at least a portion of the isolation region. A conductive contact is formed through the insulating material outside the space such that the conductive contact is in electrical communication with the first gate stack and the second gate stack.

A method for fabricating a semiconductor device in accordance with another exemplary embodiment is provided. The method comprises providing a semiconductor layer surrounded by an isolation region. The semiconductor layer comprises a first portion. A first gate stack and a second gate stack are formed on the first portion of the semiconductor layer such that the first gate stack and the second gate stack are substantially parallel and form a space therebetween. A highly intrinsically-stressed layer is formed overlying the first and second gate stacks and at least a portion of the semiconductor layer disposed within the space. An insulating material is deposited overlying the semiconductor layer and at least a portion of the isolation region. A contact is formed through the insulating material outside of the space such that the contact is in electrical communication with the first gate stack and the second gate stack.

An MOS structure in accordance with an exemplary embodiment of the present invention also is provided. The MOS structure comprises a semiconductor layer surrounded at least partially by an isolation region. The semiconductor layer has an impurity-doped first portion. A first gate stack is disposed on the first portion of the semiconductor layer and a second gate stack is disposed on the first portion of the semiconductor layer substantially parallel to the first gate stack.

The first gate stack and the second gate stack define a space therebetween. A conductive contact is disposed outside of the space and is electrically coupled to the first gate stack and the second gate stack.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
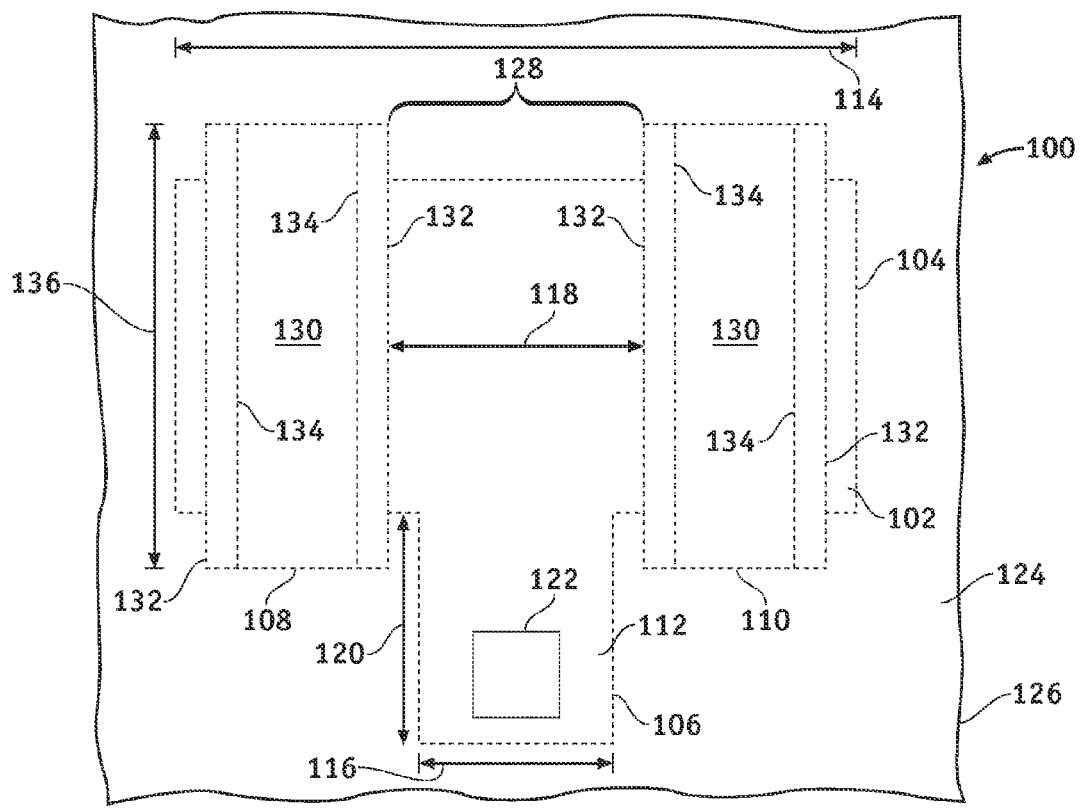
FIG. 1 is a top view of an MOS structure in accordance with an exemplary embodiment of the present invention.

FIG. 1 is a top view of an MOS structure 100 in accordance with an exemplary embodiment of the present invention. MOS structure 100 comprises two MOS transistors, first MOS transistor 108 and second MOS transistor 110. MOS transistors 108 and 110 both can be N-channel MOS transistors (NMOS transistors) or P-channel MOS transistors (PMOS transistors). While MOS structure 100 is illustrated with only two MOS transistors, it will be appreciated that MOS structure 100 may have any number of NMOS transistors and/or PMOS transistors. Those of skill in the art will appreciate that structure 100 may include a large number of such transistors as required to implement a desired circuit function.

MOS transistors 108 and 110 are formed on and within a bulk silicon substrate or, as illustrated, a silicon-on-insulator (SOI) layer 102 that is disposed on a silicon substrate (not shown). As used herein, the terms "SOI layer" and "silicon substrate" will be used to encompass the relatively pure or lightly impurity-doped monocrystalline silicon materials typically used in the semiconductor industry as well as silicon admixed with other elements such as germanium, carbon, and the like to form substantially monocrystalline semiconductor material. SOI layer 102 is doped with an impurity dopant of a conductivity type. For example, if the transistors are NMOS transistors, SOI layer 102 is doped with boron ions. If the transistors are PMOS transistors, SOI layer 102 is doped with arsenic or phosphorous ions. SOI layer 102 is surrounded by an isolation region 126 that isolates MOS transistors 108 and 110 from other semiconductor devices formed on the same semiconductor substrate. An insulating layer 124, such as a silicon oxide layer, is disposed overlying SOI layer 102, first and second MOS transistors 108 and 110, and isolation region 126.

SOI layer 102 has a first portion 104 that has a length, indicated by double-headed arrow 114. SOI layer 102 also has a second portion 106 that extends from first portion 104 and has a length, indicated by double-headed arrow 116. In one exemplary embodiment, length 114 is greater than length 116. In a preferred embodiment, length 116 is no greater than a distance, indicated by double-headed arrow 118, between first MOS transistor 108 and second MOS transistor 110. Second portion 106 also has a width, indicated by double-headed arrow 120, that extends from first portion 104 beyond MOS transistors 108 and 110.

MOS transistors 108 and 110 each comprise a gate electrode 130. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor layer or substrate. Spacers 132 formed of an insulating material are disposed about sidewalls 134 of MOS transistors 108 and 110. MOS transistors 108 and 110 are substantially parallel to each other and form a space 128 between them. Space 128 has length 118 and a width equal to a width, indicated by double-headed arrow 136, of MOS transistors 108 and 110. Highly-doped source and drain regions (not shown) are disposed within SOI layer 102 and may be aligned to gate electrodes 130 and spacers 132 to form a highly-doped surface 112 of first portion 104 and second portion 106 of SOI layer 102.

A conductive contact 122 is disposed through the insulating layer 124 to second portion 106 outside of space 128 between MOS transistors 108 and 110. Conductive contact 122 is in electrical communication with the highly-doped surface 112 via a metal silicide layer (not shown). The silicide layer may overlie the entirety of surface 112 or may overlie a portion, such as, for example, a portion underlying contact 122. In an optional embodiment, a continuous stress layer or layers (not shown) may overlie surface 112 of SOI layer 102 and MOS transistors 108 and/or 110 and underlie insulating layer 124. In this regard, contact 122 extends through the insulating layer 124 and the stress layer(s) to the metal silicide layer. Alternatively, the stress layer(s) may be formed so that it does not overlie second portion 106 and, thus, contact 122 does not extend through the stress layer(s).

Accordingly, because contact 122 is formed outside of the space 128 between MOS transistors 108 and 110, challenges with conventional contact technology can be overcome. For example, contact 122 can be fabricated with larger dimensions than if it were to be formed within space 128. Thus, contact 122 can be formed with dimensions that result in a reduction in contact resistance. In addition, because contact 122 is formed outside of space 128, current leakage between the contact and the gate electrodes can be minimized and overlay shift that can jeopardize device fabrication and performance can be avoided. Moreover, the benefits of a stress layer disposed overlying the MOS transistors and highly-doped surface 112 will not be compromised by the extension of the contact through the stress layer because, even if the contact 122 extends through the stress layer, it does so at a location where a hole in the stress layer does not compromise the integrity of the stress layer.

Figure 2:
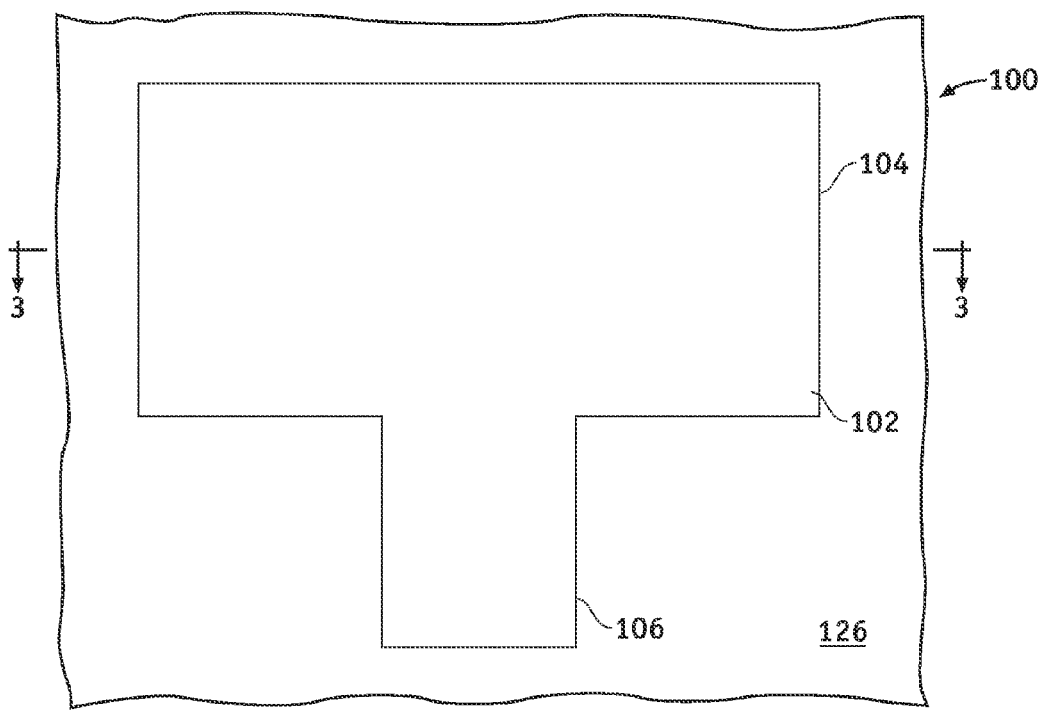
FIGS. 2-11 illustrate, in top and cross-sectional views, a method for fabricating the MOS structure of FIG. 1, in accordance with an exemplary embodiment of the present invention.
Figure 3:
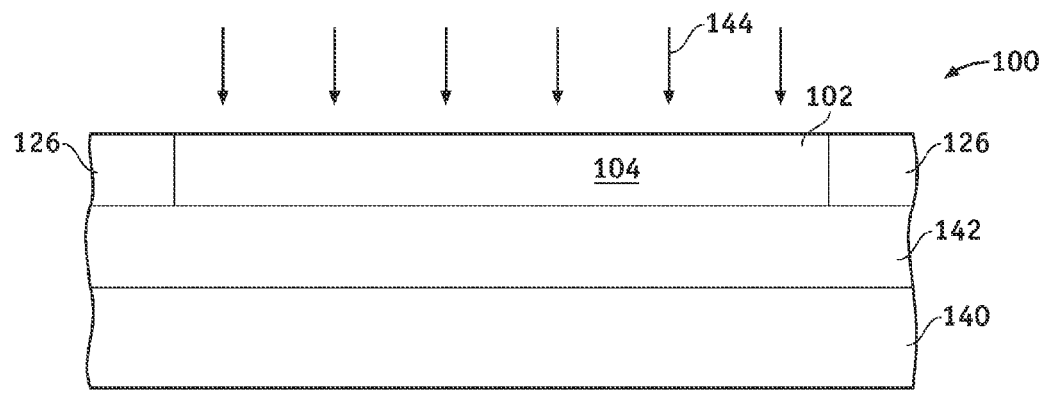

FIGS. 2-10 illustrate a method for fabricating a semiconductor device, such as MOS structure 100 of FIG. 1, in accordance with an exemplary embodiment of the present invention. Various steps in the manufacture of MOS components are well known and so, in the interest of brevity, many conventional steps will only be mentioned briefly herein or will be omitted entirely without providing the well known process details. Referring to FIGS. 2 (top view) and 3 (cross-sectional view), the method in accordance with one embodiment of the invention begins with a silicon layer, which can be either a bulk silicon wafer or, as illustrated, SOI layer 102 of an SOI structure having an insulating layer 142 disposed on a silicon substrate 140. The SOI layer 102 is electrically isolated by a dielectric isolation region 126, preferably a shallow trench isolation (STI) region. As is well known, there are many processes that can be used to form the STI, so the process need not be described here in detail. In general, STI includes a shallow trench that is etched through the SOI layer 102 to the insulating layer 142. The trench is subsequently filled with an insulating material, such as silicon oxide. After the trench is filled with the insulating material, the surface is usually planarized, for example by chemical mechanical planarization (CMP). The isolation region 126 about SOI layer 102 is formed such that SOI layer 102 has two portions, first portion 104 and second portion 106, as described above.

Following the formation of the isolation region 126, SOI layer 102 is appropriately impurity doped in known manner, for example, by ion implantation and subsequent thermal annealing of dopant ions, illustrated by arrows 144. For an NMOS transistor, a region of the SOI layer 102 upon and within which the NMOS transistor will be formed is preferably formed by implanting P-type impurity dopants (a P-well). For a PMOS transistor, a region of the SOI layer 102 upon and within which the PMOS transistor will be formed is preferably formed by implanting N-type impurity dopants (an N-well).

Figure 4:
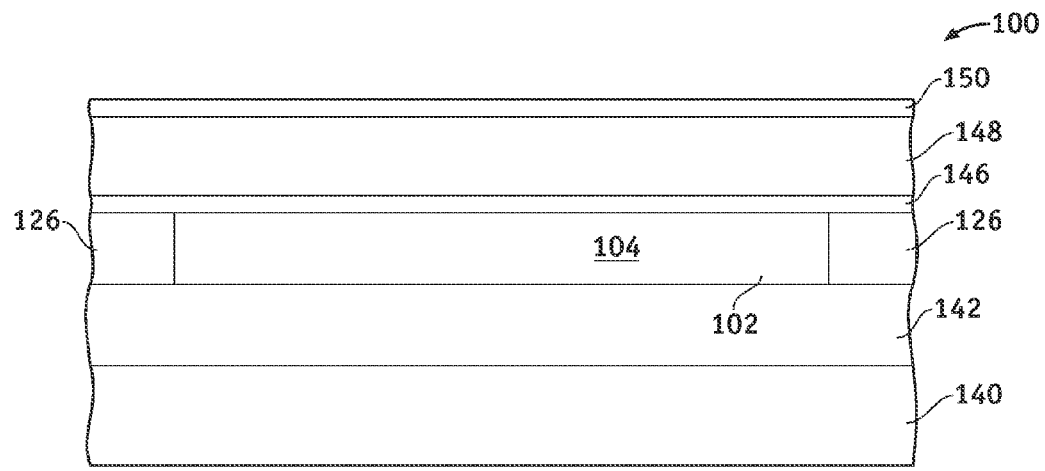

Referring to FIG. 4 (cross-sectional view), a layer of gate insulating material 146 is formed on SOI layer 102. In the conventional processing, the layer 146 of gate insulating material can be a layer of thermally grown silicon dioxide or, alternatively (as illustrated), a deposited insulator such as a silicon oxide, silicon nitride, or the like. Deposited insulators can be deposited, for example, by chemical vapor deposition (CVD), low pressure chemical vapor deposition (LPCVD), or plasma enhanced chemical vapor deposition (PECVD). Gate insulator layer 146 preferably has a thickness of about 1-10 nm, although the actual thickness can be determined based on the application of the transistor in the circuit being implemented.

A layer of gate electrode material 148 is formed overlying the gate insulating material layer 146. In accordance with one embodiment of the invention, the gate electrode material is polycrystalline silicon. The layer of polycrystalline silicon is preferably deposited as undoped polycrystalline silicon and is subsequently impurity doped by ion implantation. The polycrystalline silicon can be deposited, for example, by LPCVD by the hydrogen reduction of silane. A layer of hard mask material 150, such as silicon nitride or silicon oxynitride, can be deposited onto the surface of the polycrystalline silicon. The hard mask material can be deposited to a thickness of about 50 nm, also by LPCVD. It will be understood that, in an alternative method, a photoresist may be used instead of the hard mask material layer 150.

Figure 5:
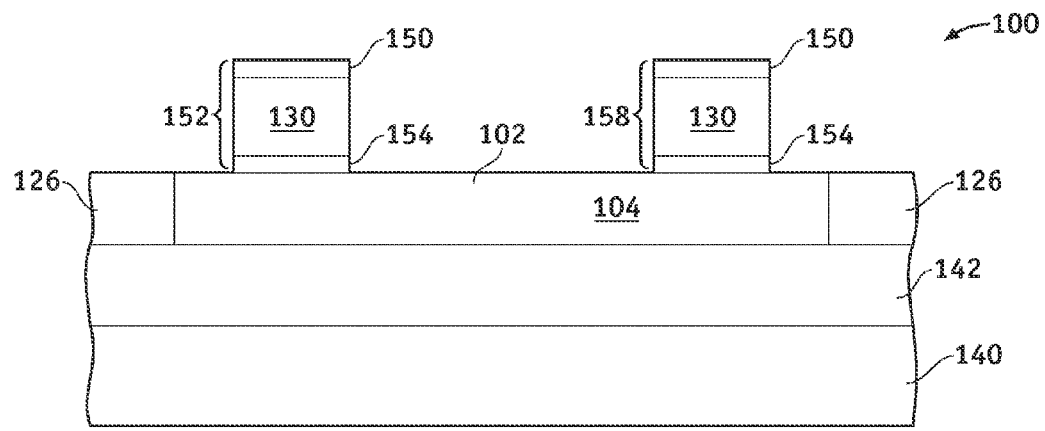

The hard mask layer 150 (or photoresist) is photolithographically patterned and the underlying gate electrode material layer 148 and the gate insulating material layer 146 are etched to form a first gate stack 152 and a second gate stack 158, each having a gate insulator 154 and a gate electrode 130, as illustrated in FIG. 5 (cross-sectional view). The polycrystalline silicon can be etched in the desired pattern by, for example, reactive ion etching (RIE) using a Cl⁻ or HBr/O₂ chemistry and the hard mask and the gate insulating material can be etched, for example, by RIE in a $CHF_3$, $CF_4$, or $SF_6$ chemistry.

Figure 6:
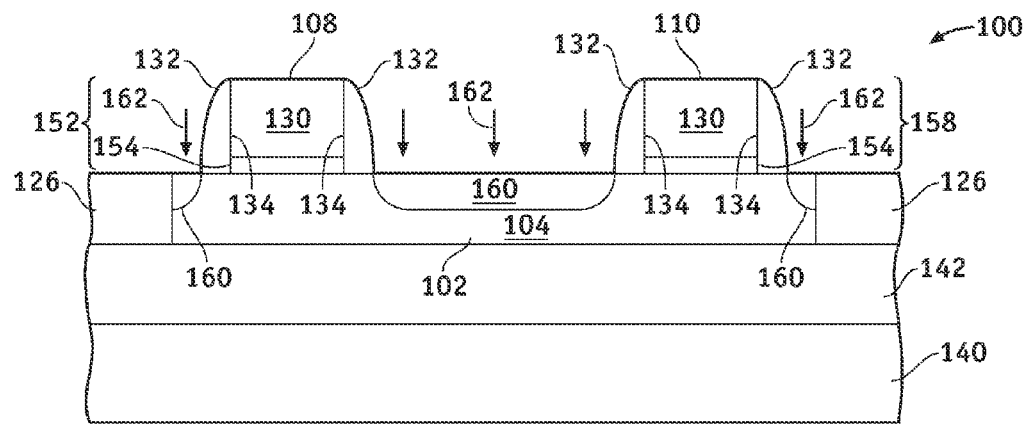

Referring to FIG. 6 (cross-sectional view), sidewall spacers 132 are formed on the sidewalls 134 of gate stacks 152 and 158. The sidewall spacers 132 are formed by depositing a layer of insulating material such as silicon oxide and/or silicon nitride and subsequently anisotropically etching the insulating layer, for example by RIE. Silicon oxide and silicon nitride can be etched, for example, in a $CHF_3$, $CF_4$, or $SF_6$ chemistry. It will be appreciated that, while only spacers 132 are illustrated, additional spacers may be formed during the fabrication of the MOS transistors. Gate stacks 152 and 158 and sidewall spacers 132 then are used as an ion implantation mask to form source and drain regions 160 in portions 104 and 106 of SOI layer 102, thus forming first MOS transistor 108 and second MOS transistor 110. By using the gate stacks and spacers as an ion implantation mask, the source and drain regions are self aligned with the gate stacks and the spacers. In an alternative method, a patterned photoresist may be used as the ion implantation mask. The source and drain regions are formed by appropriately impurity doping SOI layer 102 in known manner, for example, by ion implantation of dopant ions, illustrated by arrows 162, and subsequent thermal annealing. For NMOS transistors the source and drain regions 160 are preferably formed by implanting arsenic ions, although phosphorus ions could also be used. For PMOS transistors, the source and drain regions 160 are preferably formed by implanting boron ions. The hard mask layer 150 or photoresist then can be removed from the gate electrodes, for example, by RIE in a $CHF_3$, $CF_4$, or $SF_6$ chemistry.

Figure 7:
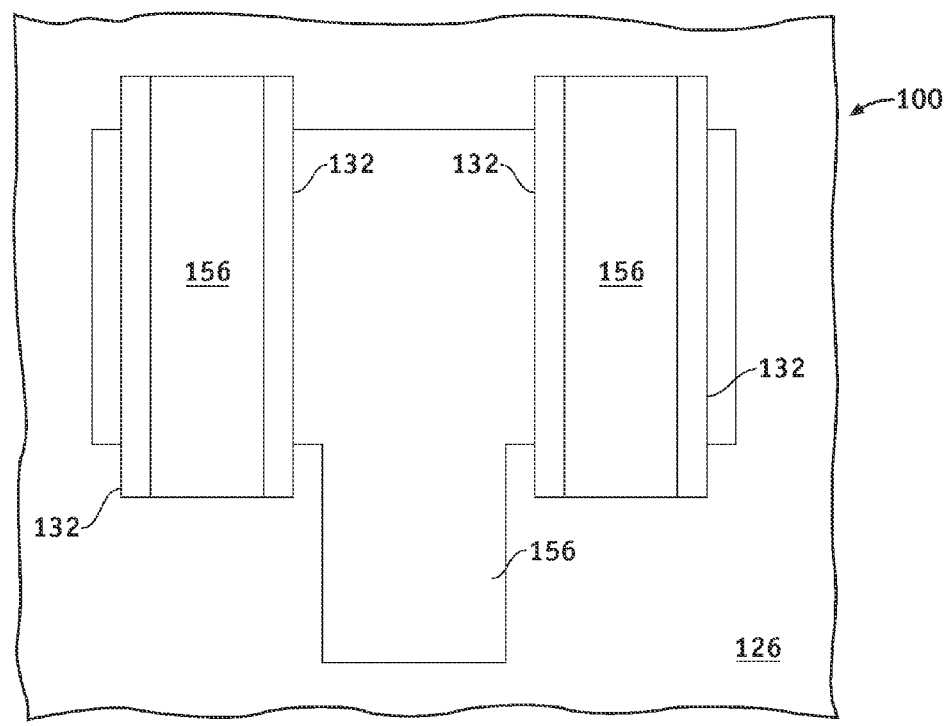

Referring to FIG. 7 (top view), in one embodiment of the invention, a blanket layer of silicide-forming metal (not shown) is deposited on highly-doped surface 112 of SOI layer 102, gate stacks 152 and 158, and sidewall spacers 132 and is heated, for example by RTA to form a metal silicide layer 156 on highly-doped surface 112 as well as on gate electrodes 130. In an alternative embodiment, the hard mask 150 or photoresist used to form gate stack 152 and 158 as illustrated in FIG. 5 is not removed after formation of the gate stacks so that formation of a metal silicide layer on the gate electrodes is prevented. The silicide-forming metal can be, for example, cobalt, nickel, rhenium, ruthenium, or palladium, or alloys thereof. The silicide-forming metal can be deposited, for example, by sputtering to a thickness of about 5-50 nm and preferably to a thickness of about 10 nm. Any silicide-forming metal that is not in contact with exposed silicon, for example the silicide-forming metal that is deposited on the sidewall spacers 132, does not react during the RTA to form a silicide and may subsequently be removed by wet etching in a $H_2O_2/H_2SO_4$ or $HNO_3/HCl$ solution.

Figure 8:
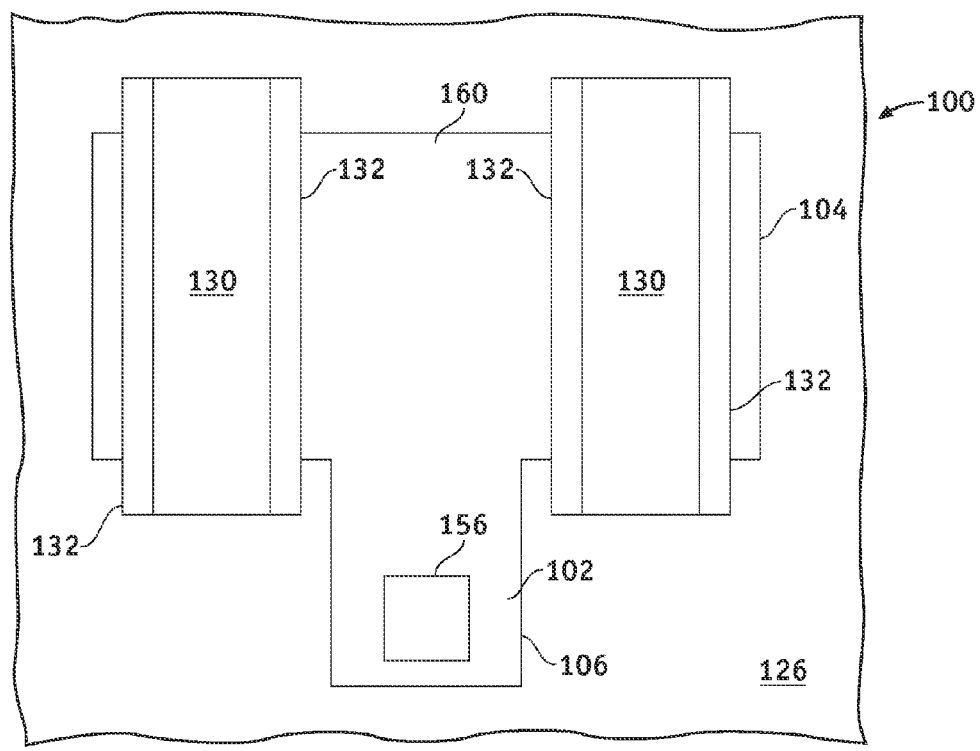

In another exemplary embodiment, as illustrated in FIG. 8 (top view), the metal silicide 156 can be formed on only a portion of surface 112. In this regard, a blanket layer of dielectric material (not shown) is deposited overlying the first and second portions of SOI layer 102 and is patterned and etched in known manner to form an opening on second portion 106 of SOI layer 102. A blanket layer of silicide-forming metal (not shown) is deposited and is heated, for example by RTA, to form a metal silicide layer 156 on highly-doped surface 112 within the opening. As described above, any silicide-forming metal that is not in contact with exposed silicon of layer 102, such as on the dielectric layer, does not react during the RTA to form a silicide and may subsequently be removed by wet etching in a $H_2O_2/H_2SO_4$ or $HNO_3/HCl$ solution.

Figure 9:
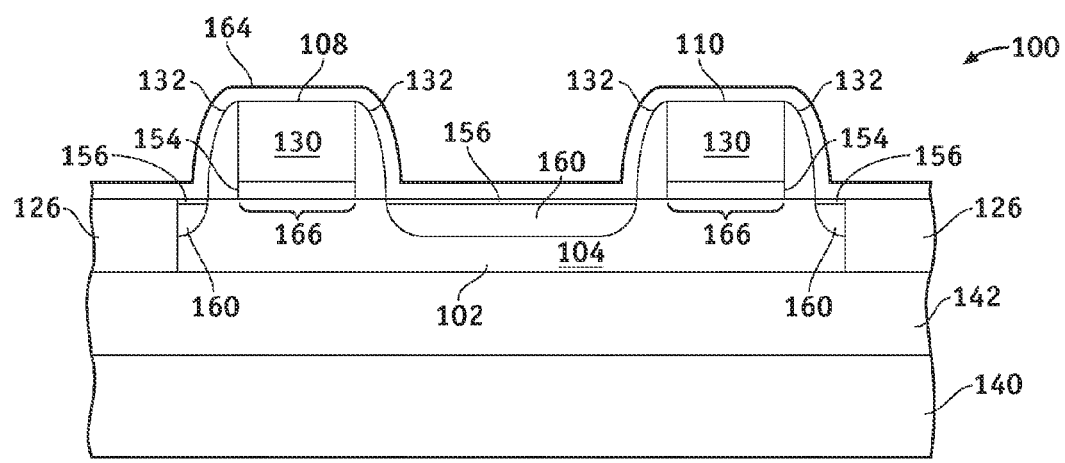

In an optional embodiment, referring to FIG. 9 (cross-sectional view), a highly intrinsically-stressed layer 164 may be formed overlying the transistors 108 and 110. The highly intrinsically-stressed layer 164 produces stress in channels 166 underlying the gate electrodes 130 so that the carrier mobility in the channels is increased, which, in turn, increases the operation speed of transistors. The highly intrinsically-stressed layer 164 may comprise any suitable insulating material, such as, for example, a silicon oxide or a silicon nitride, that has been deposited, treated, or otherwise fabricated to have an intrinsic stress that is greater than a stress that may result as a side effect of conventional oxidation, etch, deposition, or thermal steps. In other words, as used herein, the term "intrinsic stress" means that stress that is intentionally induced in layer 164 to cause a stress to be transmitted to channel regions 166. Highly intrinsically-stressed films and methods for making such films are well known in the semiconductor industry and will not be discussed further herein. For example, a tensile-stressed silicon nitride layer can be deposited onto an NMOS transistor by CVD deposition. This tensile stress increases electron mobility, thus increasing the operational speed of the NMOS transistor. Conversely, a compressive-stressed layer can be deposited onto a PMOS transistor to increase hole mobility, thus increasing the operational speed of the PMOS transistor. Alternatively, the highly intrinsically-stressed layer can be used to decrease electron mobility. For example, a tensile-stressed silicon nitride layer can be deposited onto an PMOS transistor by CVD deposition. This tensile stress decreases hole mobility for a desired device operation or design. Conversely, a compressive-stressed layer can be deposited onto a NMOS transistor to decrease electron mobility. In an exemplary embodiment of the invention, using appropriate masking techniques, a tensile stress layer may be deposited on first MOS transistor 108 to improve or degrade its device performance and a compressive stress layer may be deposited on second MOS transistor 108 to improve or degrade its device performance.

Figure 10:
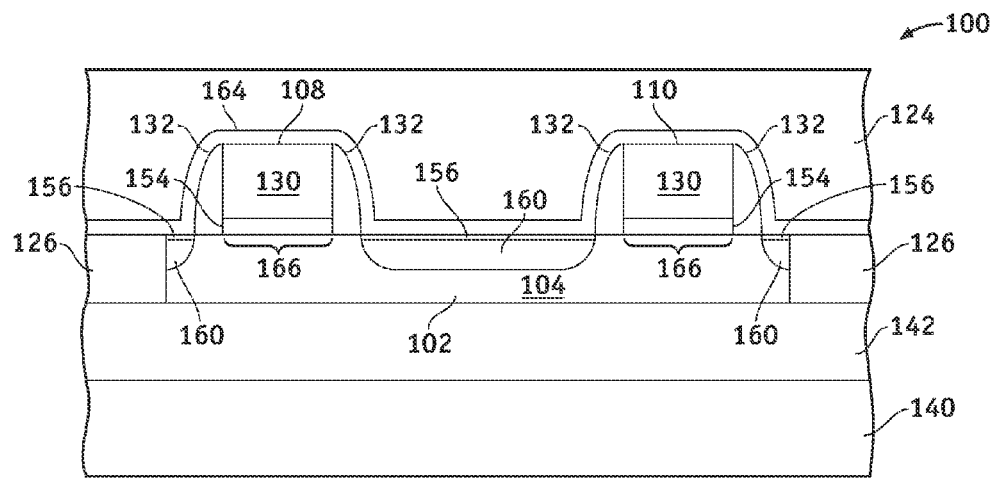
Figure 11:
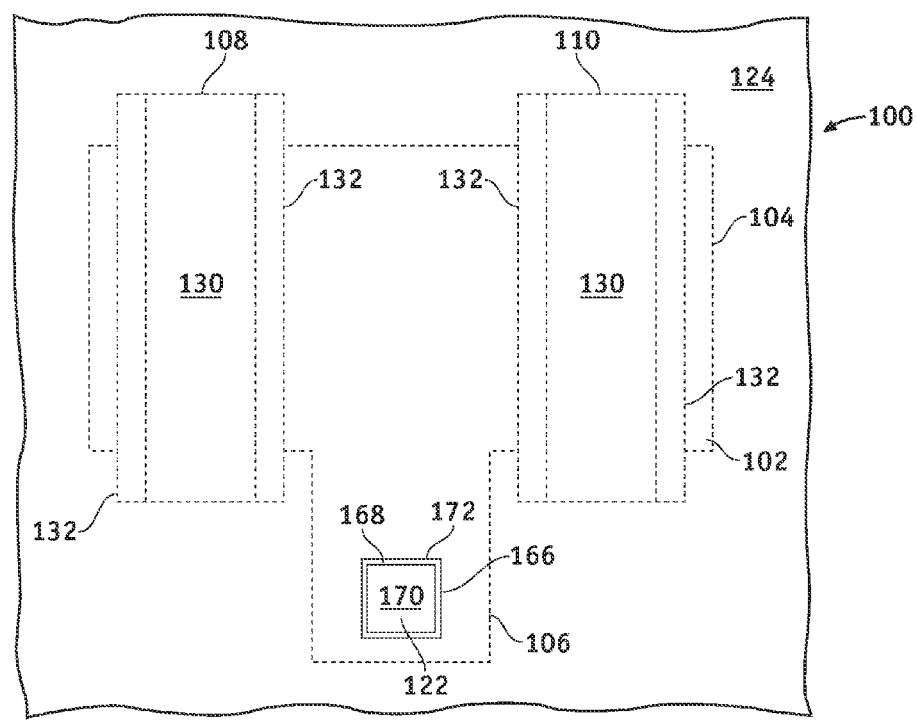

The method continues, in accordance with an exemplary embodiment of the present invention, with the deposition of a blanket insulating layer 124 on MOS structure 100, as illustrated in FIG. 10 (cross-sectional view). Referring to FIG. 11 (top view), the insulating layer 124 is photolithographically patterned and etched to form a contact opening 166 extending through insulating layer 124 and exposing at least a portion of metal silicide layer 156 on second portion 106 of highly-doped surface 112. The insulating layer may be planarized by a CMP process before patterning. Conductive contact 122 is formed in contact opening 166 so that the source and drain regions can be appropriately connected electrically to other devices in the integrated circuit to implement the desired circuit function. In an exemplary embodiment of the present invention, conductive contact 122 is formed by the deposition of a thin first barrier layer 172, such as, for example, titanium nitride, and a thin second barrier layer 168, such as, for example, Ti, within contact opening 166, followed by the deposition of a conductive plug 170, such as, for example, W. The barrier layers are used to prevent diffusion of tungsten hexafluoride $WF_6$, used during formation of conductive plug 170, into the insulating layer 124 and to enhance adhesion of the conductive plug to the walls of the contact opening. It will be appreciated that other layers may be utilized to form conductive contact 122. For example, a layer of tantalum may be deposited before barrier layer 168 is formed.

Figure 16:
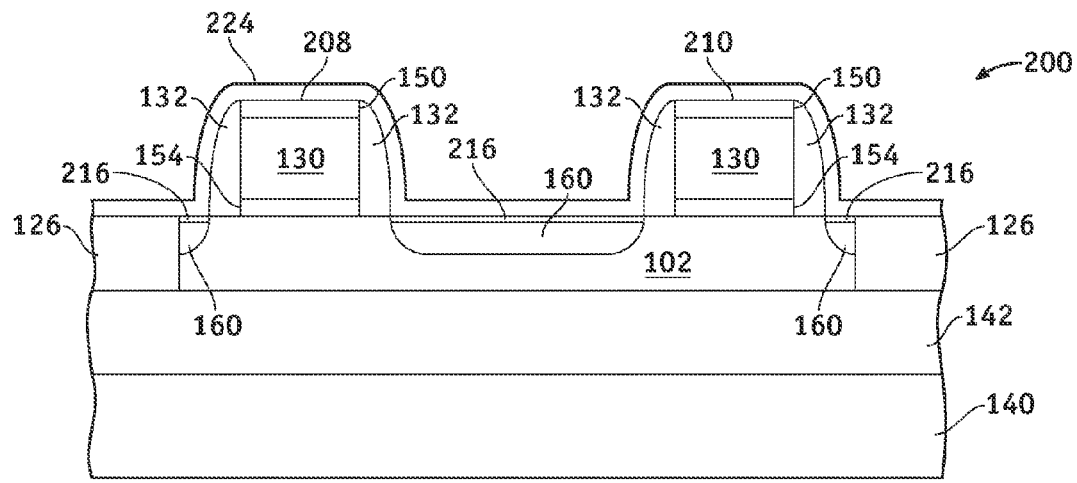
Figure 17:
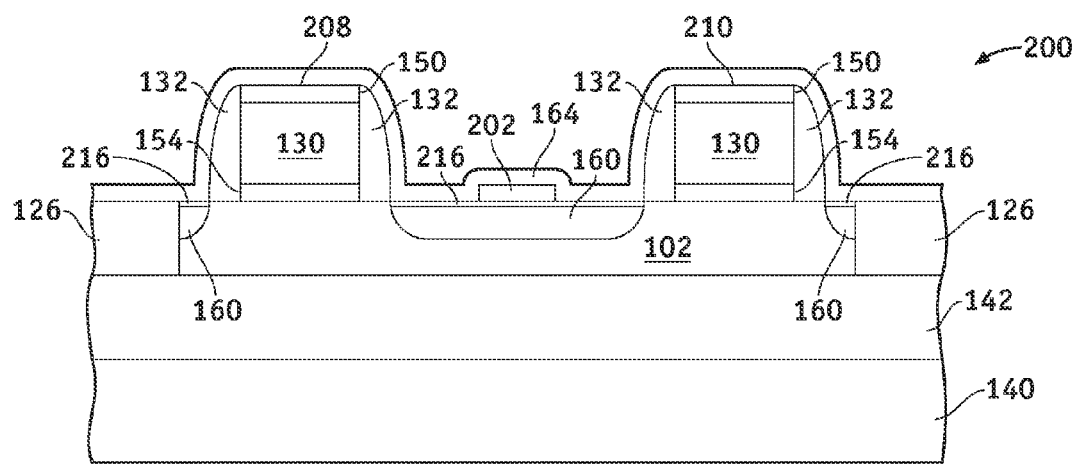
Figure 18:
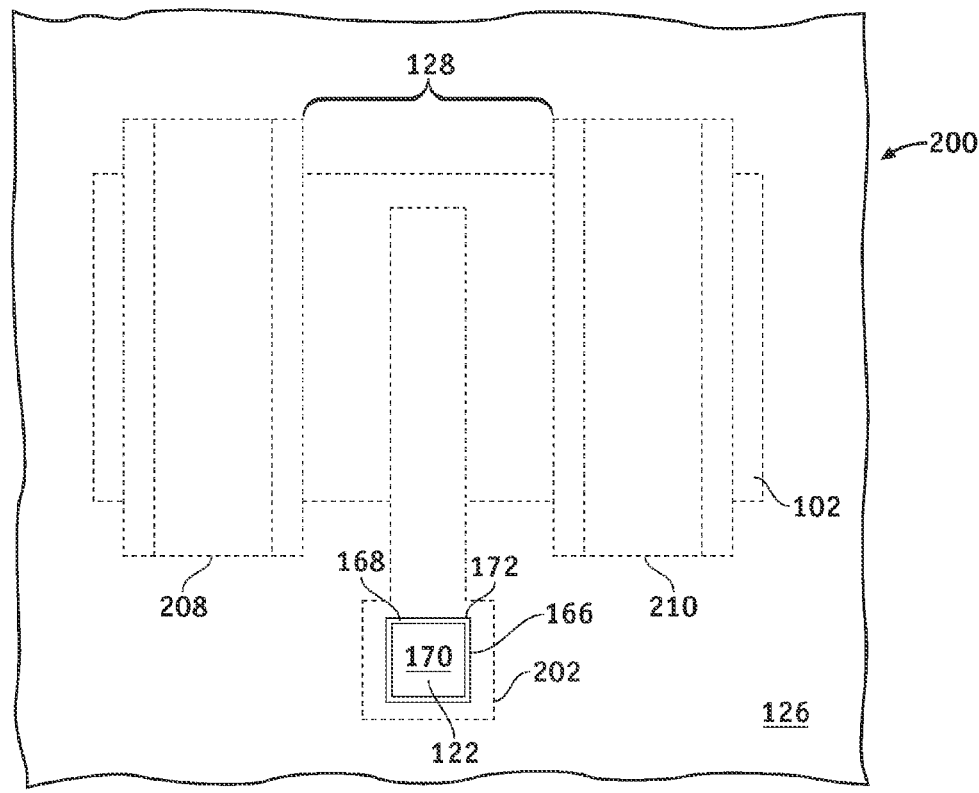
Figure 19:
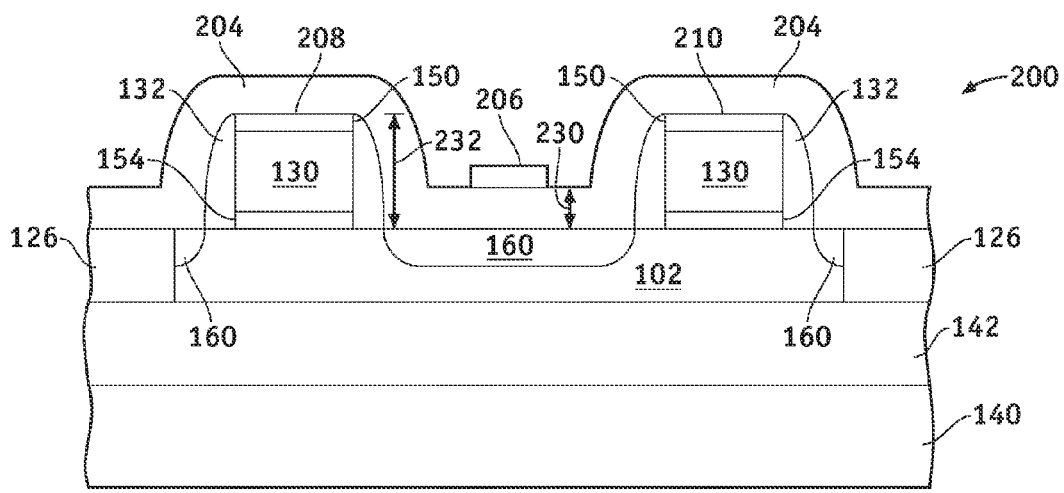
FIGS. 19-24 illustrate, in cross-sectional views, a method for fabricating an MOS structure, in accordance with another exemplary embodiment of the present invention.

FIGS. 12-21 illustrate a method for fabricating an MOS structure 200, in accordance with another exemplary embodiment of the present invention. Referring momentarily to FIG. 18 (top view), MOS structure 200 is similar to MOS structure 100 of FIG. 1 to the extent that MOS structure 200 also utilizes a remote conductive contact 222 to electrically access a first MOS transistor 208 and a second MOS transistor 210. However, unlike MOS structure 100, the conductive contact 222 of MOS structure 200 is not disposed overlying a portion of SOI layer 102. Instead, conductive contact 222 is electrically coupled to the highly-doped surface 112 of SOI layer 102 via a contact member 202 that extends from SOI layer 102 to isolation region 126.

Figure 12:
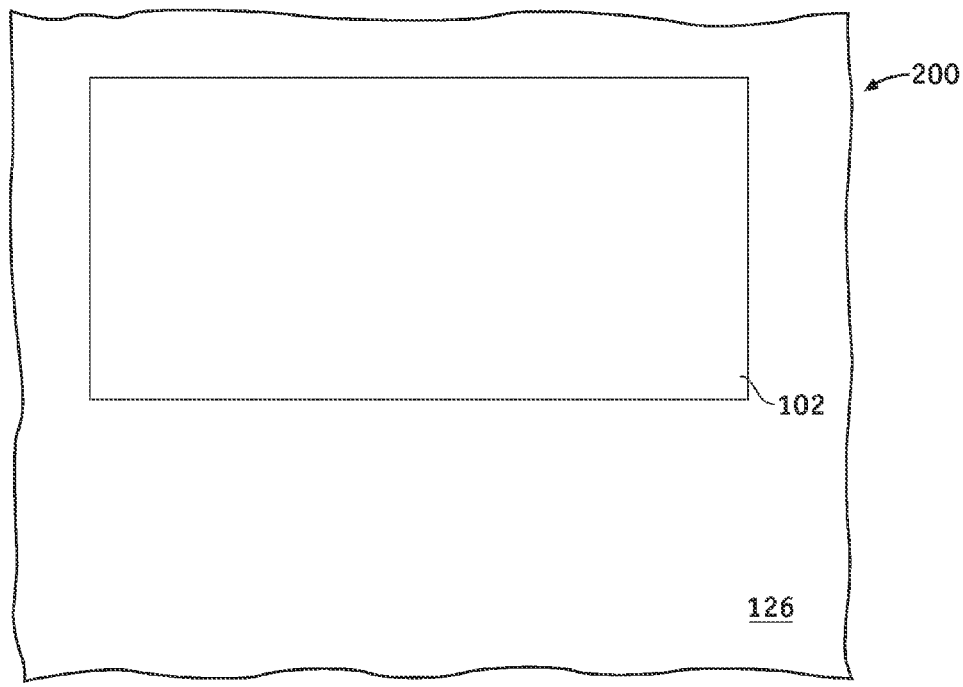
FIGS. 12-18 illustrate, in top and cross-sectional views, a method for fabricating an MOS structure, in accordance with another exemplary embodiment of the present invention.
Figure 13:
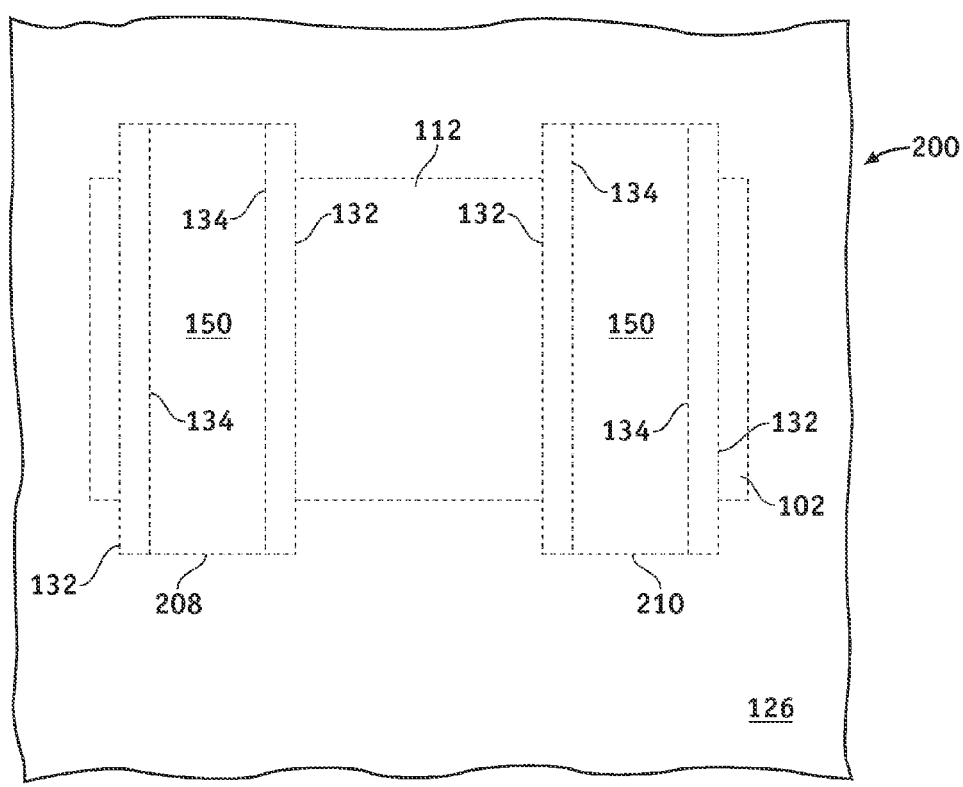

Referring to FIG. 12 (top view), the method in accordance with one embodiment of the invention begins with a silicon layer, which can be either a bulk silicon substrate or, as illustrated, SOI layer 102. The SOI layer 102 is electrically isolated by dielectric isolation region 126, as described above. The various steps described above with reference to FIGS. 3-6 then are performed so that a structure, such as that illustrated in FIG. 13 (top view), is formed with first MOS transistor 208 and second MOS transistor 210 having gate electrodes 130, optionally capped by hard mask layer 150, and spacers 132 about sidewalls 134.

Figure 14:
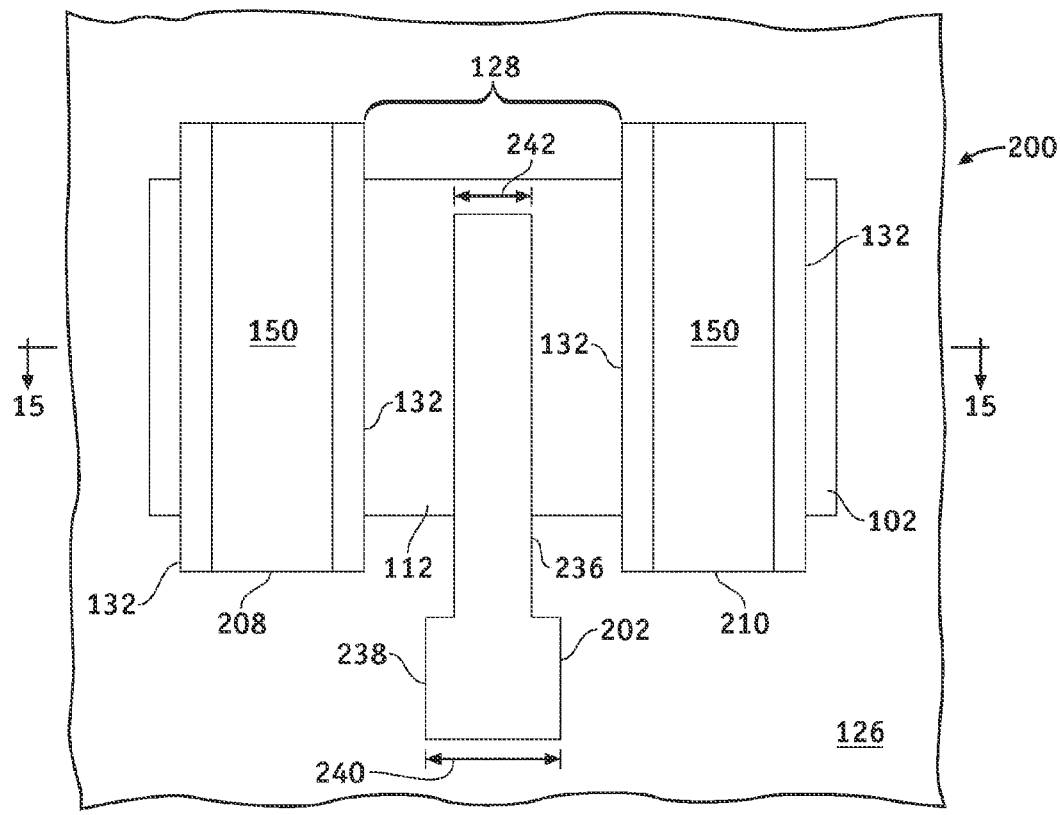
Figure 15:
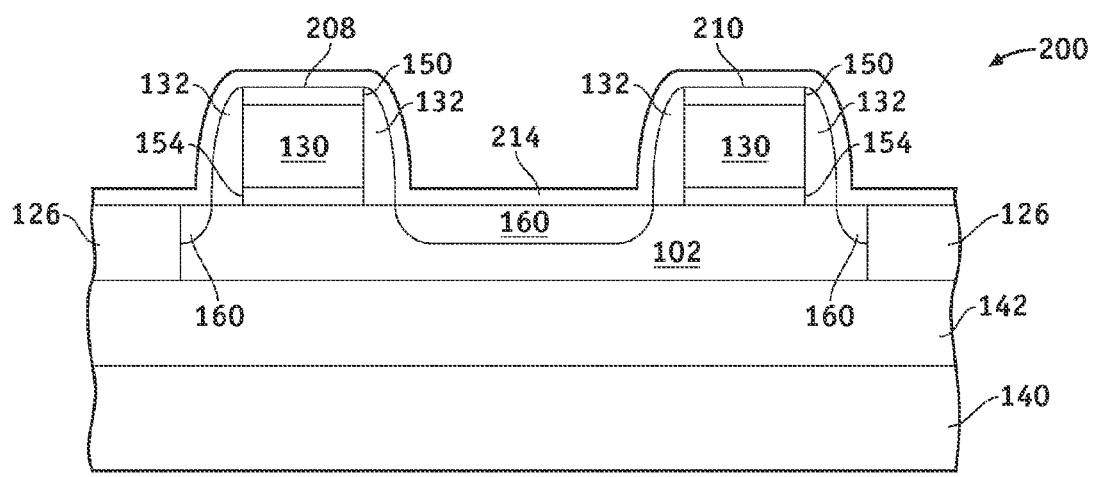

After the ion implantation of SOI layer 102 to form the highly-doped surface 112 of SOI layer 102, as described above with reference to FIG. 6, a contact member 202 is formed, as illustrated in FIG. 14 (top view). While the contact member 202 is illustrated in FIG. 14 with a first rectangular portion 236 disposed at least partially within space 128 and a second rectangular portion 238 disposed outside of space 128, it will be appreciated that contact member 202 may have any suitable geometry or configuration that permits contact member 202 to extend from SOI layer 102 within space 128 to isolation region 126 outside of space 128 without interfering with MOS transistors 208 and/or 210. In one exemplary embodiment, portion 238 has a length, illustrated by double-headed arrow 240, that is greater than a length, illustrated by double-headed arrow 242, of portion 236. In this regard, a larger conductive contact can be formed overlying portion 238 than would be desirable to form between MOS transistors 208 and 210. Contact member 202 may be formed using a variety of methods. For example, contact member 202 may be formed of a conductive material, such as a metal. In this regard, referring to FIG. 15 (cross-sectional view), a blanket layer of silicide-forming metal 214 is deposited overlying MOS structure 200 and is heated, for example by RTA, to form a metal silicide layer 216 on SOI layer 102, as illustrated in FIG. 16 (cross-sectional view). As described above, any silicide-forming metal that is not in contact with exposed silicon of layer 102, such as that overlying isolation region 126, does not react during the RTA to form a silicide and may subsequently be removed by wet etching in a $H_2O_2/H_2SO_4$ or $HNO_3/HCl$ solution. A layer of conductive material 224 then is deposited overlying MOS structure 200. The conductive material may comprise, for example, tungsten, aluminum, copper or other conductive material that can be suitably etched. The conductive material layer 224 may be deposited to a thickness of, for example, about 30-50 nm. A photoresist (not shown) is formed on the conductive material layer 224 and is patterned using conventional methods. The conductive material layer 224 is etched using an appropriate etchant to form contact member 202, as illustrated in FIG. 17 (cross-sectional view). Highly intrinsically-stressed layer 164 may be formed overlying MOS transistors 208 and 210 and overlying contact member 202. Referring to FIG. 18 (top view), the method continues with the deposition of insulating layer 124. Insulating layer 124 is photolithographically patterned and etched to form contact opening 166 extending through insulating layer 124 and exposing a portion of contact member 202 that overlies isolation region 126 and is disposed outside space 128. Conductive contact 222 then is formed in contact opening 166. In an exemplary embodiment, conductive contact 222 is formed by the deposition of thin first barrier layer 172, such as, for example, titanium nitride, and thin second barrier layer 168, such as, for example, Ti, within contact opening 166, followed by the deposition of conductive plug 170, such as, for example, W. It will be appreciated that other layers may be utilized to form conductive contact 222. For example, a layer of tantalum may be deposited before barrier layer 168 is formed.

Figure 20:
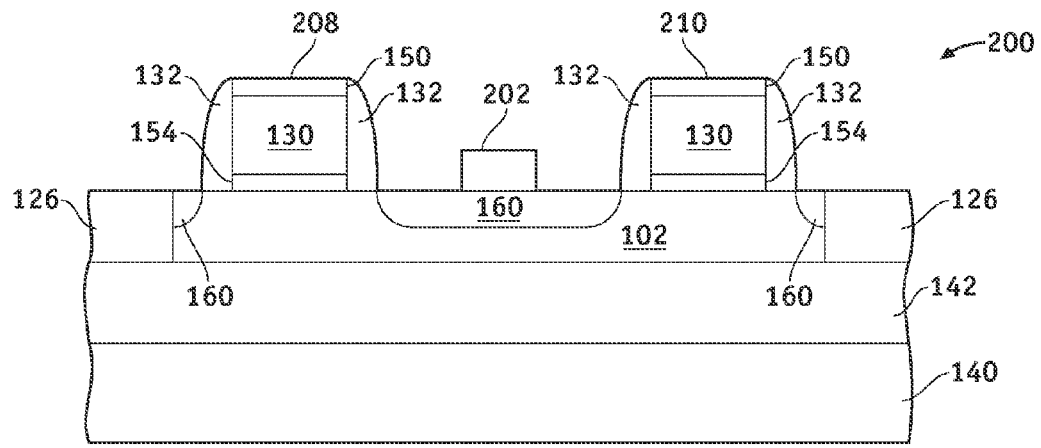

In another exemplary embodiment of the present invention, contact member 202 may be formed of polycrystalline silicon. In this regard, referring to FIG. 19 (cross-sectional view), after the formation of MOS transistors 208 and 210, including source/drain regions 160, a blanket layer of polycrystalline silicon 204 is deposited. The polycrystalline silicon layer 204 can have any suitable thickness that permits current flow through subsequently-formed contact member 202 from a conductive contact to the source/drain regions 160 disposed between MOS transistors 208 and 210. In one exemplary embodiment, polycrystalline silicon layer 204 has a thickness, indicated by double-headed arrow 230, that is at least about half the thickness, indicated by double-headed arrow 232, of gate electrodes 130 as measured from SOI layer 102. A layer of hard mask material (not shown) or photoresist (not shown) is deposited onto the surface of the polycrystalline silicon. The hard mask layer or photoresist is photolithographically patterned to form etch mask 206 and the underlying polycrystalline silicon layer 204 is etched to form contact member 202, as illustrated in FIG. 20 (cross-sectional view). The mask 206 is removed and, in an optional embodiment, the contact member 202 can be further etched to reduce its height.

Figure 21:
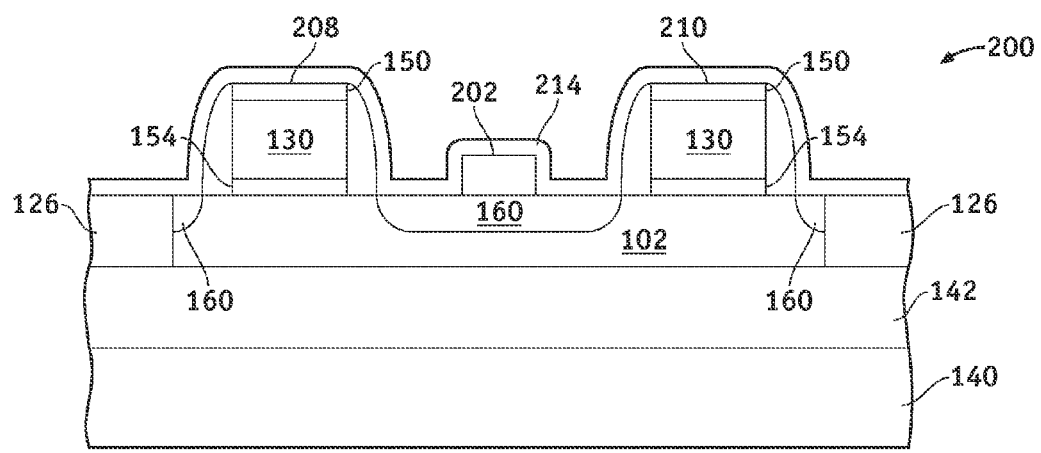
Figure 22:
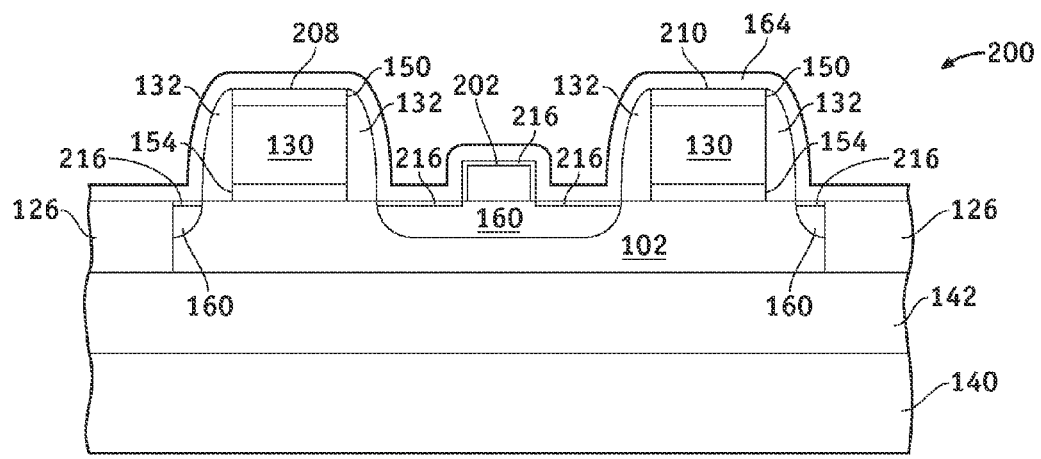
Figure 23:
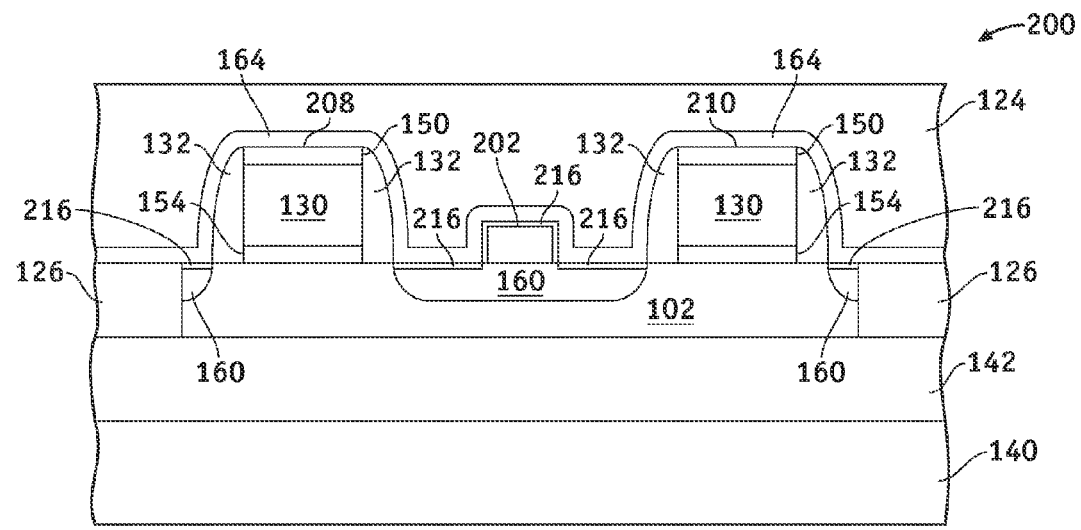

Referring to FIG. 21 (cross-sectional view), a blanket layer of metal silicide-forming material 214 is deposited on MOS transistors 208 and 210, sidewall spacers 132, SOI layer 102, and contact member 202 and is heated, for example by RTA, to form a metal silicide layer 216 on contact member 202 and SOI layer 102, as illustrated in FIG. 22 (cross-sectional view). Any silicide-forming metal that is not in contact with exposed silicon, such as that overlying isolation region 126, does not react during the RTA to form a silicide and may subsequently be removed by wet etching in a $H_2O_2/H_2SO_4$ or $HNO_3/HCl$ solution. In another exemplary embodiment, after the formation of metal silicide layer 216, highly intrinsically-stressed layer 164 may be formed as described above to overlie MOS transistors 208 and 210, contact member 202, and source/drain regions 160. Referring to FIG. 23 (cross-sectional view), the method continues with the deposition of insulating layer 124 and the formation of conductive contact 222, as described above with reference to FIG. 18. Accordingly, conductive contact 222 is in electrical communication with source/drain regions 160 of MOS transistors 208 and 210 via polycrystalline silicon contact member 202 and metal silicide layer 216.

Figure 24:
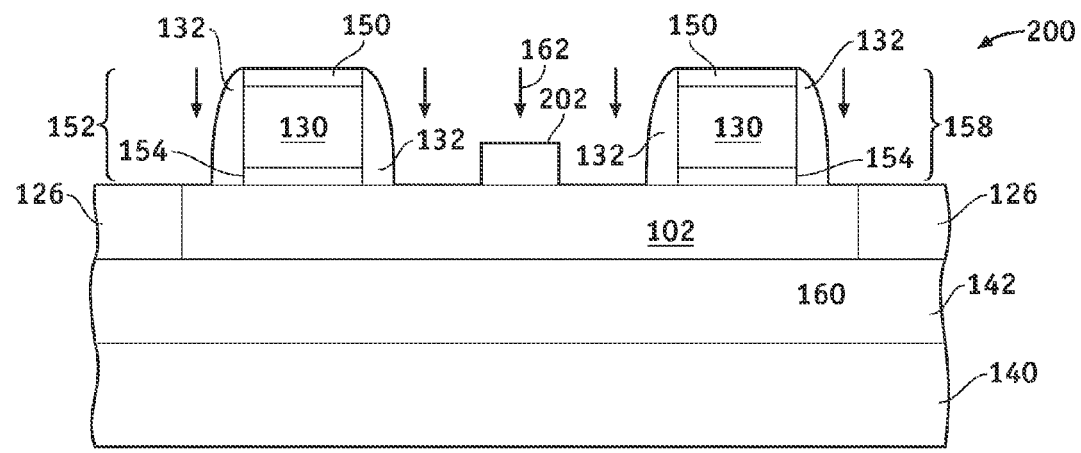

In an alternative embodiment of the invention, it will be appreciated that, rather than forming polycrystalline silicon contact member 202 after the formation of MOS transistors 208 and 210, including source/drain regions 160, polycrystalline silicon contact member 202 may be formed, as described above, after the formation of gate stacks 152 and 158 and before the formation of source/drain regions 160. In this regard, as illustrated in FIG. 24 (cross-sectional view), after formation of contact member 202, gate stacks 152 and 158 and sidewall spacers 132 are used as an ion implantation mask to form source and drain regions 160 in SOI layer 102, thus forming first MOS transistor 208 and second MOS transistor 210 and impurity doping polycrystalline silicon contact member 202. The source and drain regions are formed by appropriately impurity doping SOI layer 102 in known manner, for example, by ion implantation of dopant ions, illustrated by arrows 162, and subsequent thermal annealing. After the ion implantation, the steps described above with reference to FIGS. 21-23 are performed, resulting in the formation of conductive contact 222 so that it is in electrical communication with MOS transistors 208 and 210 via polycrystalline silicon contact member 202 and metal silicide layer 216.

Figure 25:
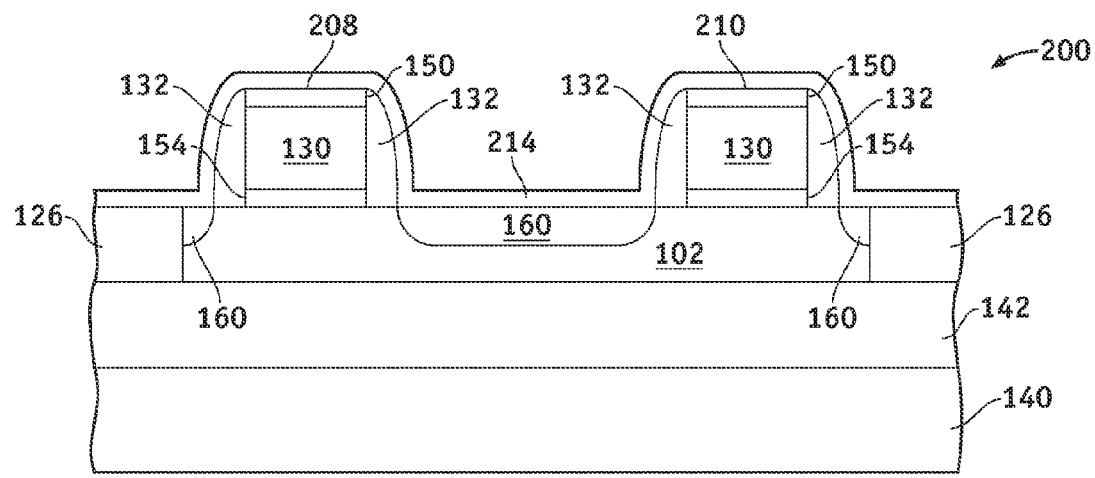
FIGS. 25-30 illustrate, in top and cross-sectional views, a method for fabricating an MOS structure, in accordance with another exemplary embodiment of the present invention.
Figure 26:
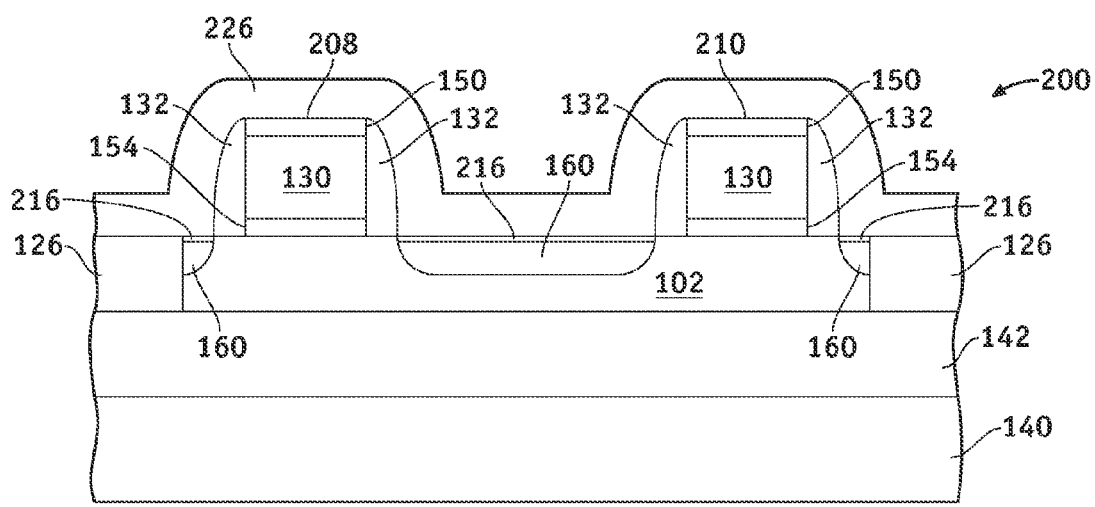
Figure 27:
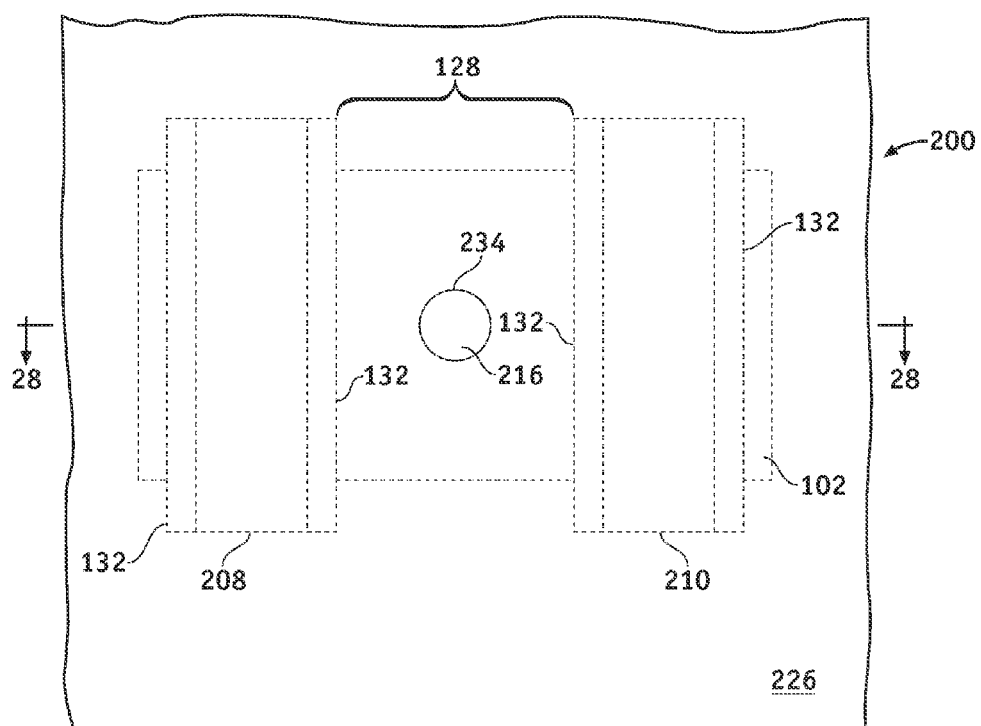
Figure 28:
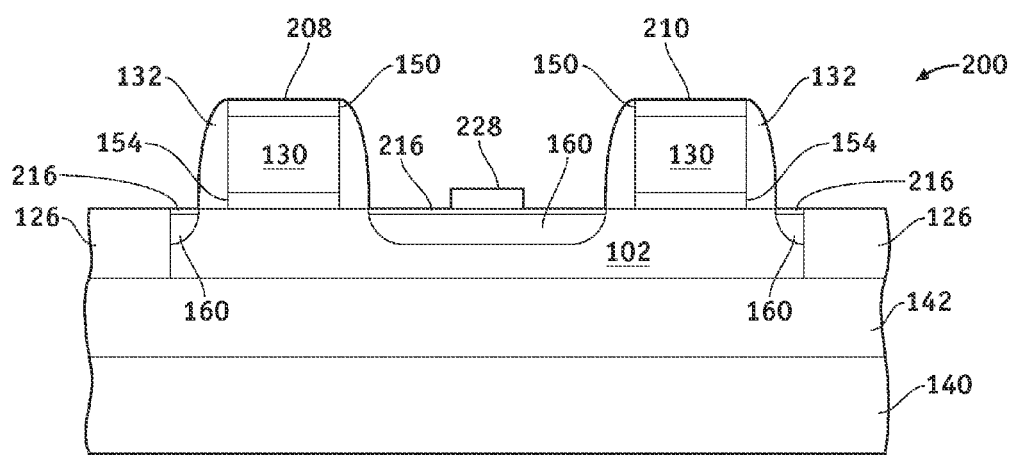

In another exemplary embodiment of the present invention, contact member 202 may be formed of one or more carbon nanotubes. In this regard, referring to FIG. 25 (cross-sectional view), after the formation of MOS transistors 208 and 210, including source and drain regions 160, a blanket layer of silicide-forming metal 214 is deposited overlying MOS structure 200 and is heated, for example by RTA, to form a metal silicide layer 216 on SOI layer 102, as illustrated in FIG. 26 (cross-sectional view). As described above, any silicide-forming metal that is not in contact with exposed silicon of layer 102 does not react during the RTA to form a silicide and may subsequently be removed by wet etching in a $H_2O_2/H_2SO_4$ or $HNO_3/HCl$ solution. In one exemplary embodiment, a layer 226 of insulating material, such as, for example, silicon dioxide, is deposited overlying MOS structure 200. Referring to FIG. 27 (cross-sectional view), the insulating material layer 226 is photolithographically patterned and etched using conventional methods to form an opening 234 that is disposed within space 128 and that exposes metal silicide layer 216. Catalytic particles then are deposited on metal silicide layer 216 within opening 234. The insulating material layer 226 is removed, leaving an island 228 of catalytic particles, as illustrated in FIG. 28 (cross-sectional view). In another exemplary embodiment, catalytic particle island 228 may be formed by depositing a layer of catalytic particles (not shown), forming a patterned mask overlying the catalytic particles layer, etching the catalytic particles layer to form island 228, and removing the patterned mask.

Figure 29:
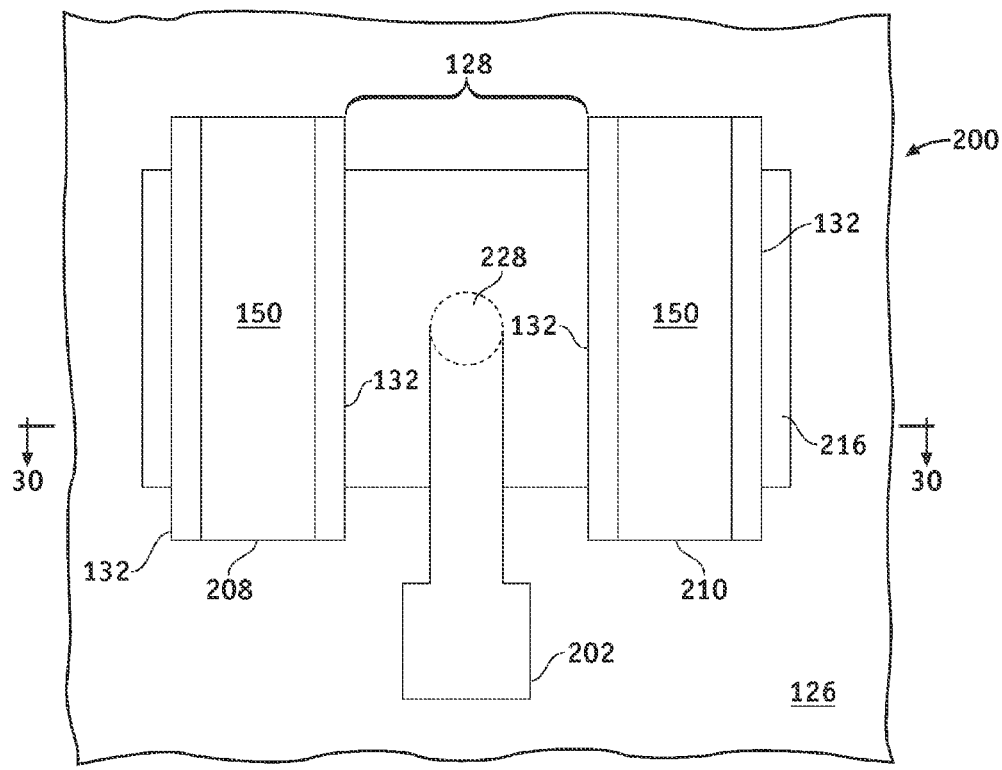

The method continues with the growth of the carbon nanotube from catalytic particles island 228 to a portion of isolation region 126 that is disposed outside of space 128, as illustrated in FIG. 29 (top view). The carbon nanotube can be grown, for example, by passing a carbon-containing gas, such as a hydrocarbon, over the catalyst particles. The catalyst particles catalyze the breakdown of the gaseous molecules into carbon, and a tube then begins to grow with metal particles at a tip. Directional growth of the carbon nanotube from island 228 to isolation region 126 outside of space 128 can be obtained by controlling of the gas flow.

Figure 30:
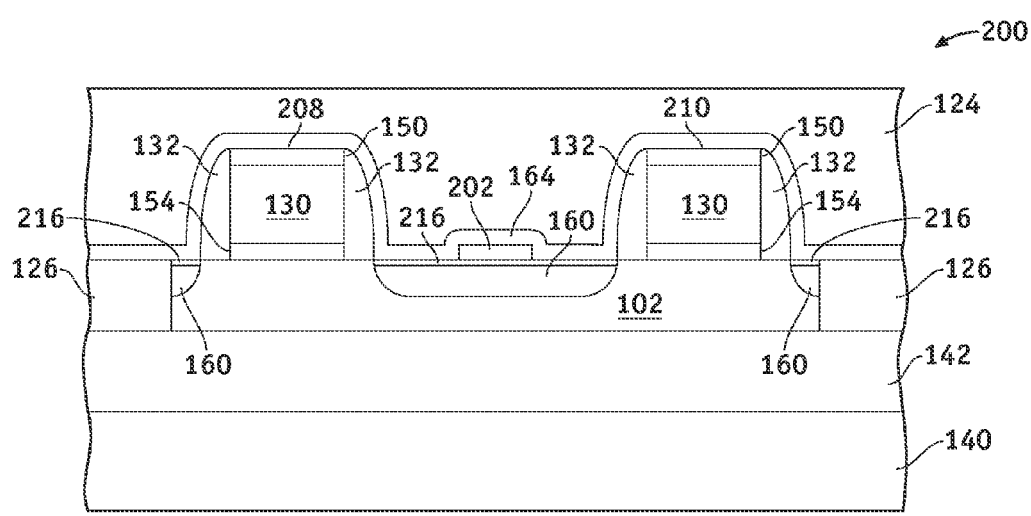

Referring to FIG. 30 (cross-sectional view), after the formation of carbon nanotube contact member 202, highly intrinsically-stressed layer 164 may be deposited overlying MOS structure 200, followed by the deposition of insulating layer 124. Conductive contact 222 then is formed through insulating layer 124 to a portion of contact member 202 that overlies isolation region 126 outside of space 128, as described above with reference to FIG. 18, so that it is in electrical communication with MOS transistors 208 and 210 via metal silicide layer 216 and carbon nanotube contact member 202. In this manner, conductive contact 222 is in electrical communication with source/drain regions 160 of MOS transistors 208 and 210 via carbon nanotube conductive member 202 and metal silicide layer 216.

Accordingly, MOS structures with conductive contacts formed remote from gate electrodes and methods for fabricating such MOS structures have been provided. Because the conductive contact is formed outside of a space between the gate electrodes of the MOS transistors of an MOS structure, the contact can be fabricated with larger dimensions than if it were to be formed between the MOS transistors. Thus, the contact can be formed with dimensions that result in a reduction in contact resistance. In addition, because the contact is formed outside of the space between the MOS transistors, current leakage between the contact and the gate electrodes can be minimized and overlay shift that can jeopardize device fabrication and performance can be avoided. Moreover, the benefits of a stress layer disposed overlying the MOS transistors will not be compromised by the extension of the contact through the stress layer. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating an MOS structure, the method comprising the steps of:
   providing a semiconductor layer having a first portion at least partially surrounded by an isolation region, the first portion having a length, and a second portion extending from the first portion and surrounded on three sides by the isolation region, the second portion having a length less than the length of the first portion;
   forming a first gate stack and a second gate stack on the first portion of the semiconductor layer, wherein the first gate stack and the second gate stack are substantially parallel;
   depositing an insulating material overlying the first portion and the second portion of the semiconductor layer and at least a portion of the isolation region; and
   forming a conductive contact through the insulating material to the second portion and outside an entire space between the first gate stack and the second gate stack, as viewed from a plan view, such that the conductive contact is in electrical communication with the first gate stack and the second gate stack via a portion of the semiconductor layer within the space.

2. The method of claim 1, further comprising, after the step of forming a first gate stack and a second gate stack and before the step of depositing an insulating material, the step of forming a highly intrinsically-stressed layer overlying at least the first gate stack, and wherein the step of forming a conductive contact comprises the step of forming the conductive contact through the insulating material and the highly intrinsically-stressed layer.

3. The method of claim 1, wherein the step of forming a conductive contact comprises the steps of:
   etching a contact opening through the insulating material overlying the second portion; and
   depositing a conductive material in the contact opening.

4. The method of claim 3, further comprising, before the step of depositing an insulating material, the step of forming a metal silicide layer on the second portion of the semiconductor layer.

5. The method of claim 1, wherein the entire space has a length and wherein the step of providing the semiconductor layer comprises providing a semiconductor layer wherein the second portion has a length that is no greater than the length of the space.

6. The method of claim 1, further comprising, after the step of forming a first gate stack and a second gate stack and before the step of depositing an insulating material, the steps of:
   depositing a polycrystalline silicon layer overlying the first portion and the isolation region; and
   etching the polycrystalline silicon layer to form a contact member that extends from the first portion to a portion of the isolation region that is disposed outside the space;
wherein the step of forming a conductive contact comprises the step of forming the conductive contact through the insulating material so that it is physically coupled to a region of the contact member that overlies the portion of the isolation region that is disposed outside the space.

7. The method of claim 6, further comprising, after the step of forming a contact member and before the step of depositing the insulating material, the step of forming a metal silicide layer on the contact member such that the conductive contact is physically coupled to the region of the contact member via the metal silicide layer.

8. The method of claim 6, further comprising, after the step of etching the polycrystalline silicon layer, the step of implanting ions of a conductivity type into the semiconductor layer and the contact member.

9. The method of claim 1, further comprising, after the step of forming a first gate stack and a second gate stack and before the step of depositing an insulating material, the steps of:
   depositing a conductive material overlying the first portion and the isolation region; and
   etching the conductive material to form a contact member that extends from the first portion to a portion of the isolation region that is disposed outside the space;
wherein the step of forming a conductive contact comprises the step of forming the conductive contact through the insulating material so that it is physically coupled to a region of the contact member that overlies the portion of the isolation region that is disposed outside the space.

10. The method of claim 9, further comprising, before the step of depositing a conductive material, the step of forming a metal silicide layer on the first portion.

11. The method of claim 1, further comprising, after the step of forming a first gate stack and a second gate stack and before the step of depositing an insulating material, the step of:
   forming a contact member from a carbon nanotube that extends from the semiconductor layer to a portion of the isolation region that is disposed outside the space;
wherein the step of forming a conductive contact comprises the step of forming the conductive contact through the insulating material so that it is physically coupled to a region of the contact member that overlies the portion of the isolation region that is disposed outside the space.

12. A method for fabricating a semiconductor device, the method comprising the steps of:
   providing a semiconductor layer having a first portion at least partially surrounded by an isolation region, the first portion having a length, and a second portion extending from the first portion and surrounded on three sides by the isolation region, the second portion having a length less than the length of the first portion
   forming a first gate stack and a second gate stack on the first portion of the semiconductor layer such that the first gate stack and the second gate stack are substantially parallel;

forming a highly intrinsically-stressed layer overlying the first and second gate stacks and at least a portion of the semiconductor layer disposed within the space;

depositing an insulating material overlying the semiconductor layer and at least a portion of the isolation region; and forming a contact through the insulating material to the second portion outside of an entire space between the first gate stack and the second gate stack, as viewed from a plan view, such that the contact is in electrical communication with the first gate stack and the second gate stack via a portion of the semiconductor layer within the space.

13. The method of claim 12, further comprising, after the step of forming a first gate stack and a second gate stack and before the step of forming a highly intrinsically-stressed layer, the step of implanting ions of a conductivity impurity type into the first and second portions using the first and second gate stacks as an implantation mask.

14. The method of claim 12, further comprising, after the step of forming a first gate stack and a second gate stack and before the step of forming a highly intrinsically-stressed layer, the step of forming a contact member that extends from the first portion to the isolation region, wherein the step of forming a contact comprises the step of forming the contact so that it is electrically coupled to the contact member.

15. The method of claim 14, wherein the step of forming a contact member comprises the step of forming the contact member of conductive material.

16. The method of claim 14, wherein the step of forming a contact member comprises the step of forming the contact member of polycrystalline silicon.

17. The method of claim 16, further comprising, after the step of forming the contact member of polycrystalline silicon, the step of implanting ions of a conductivity impurity type into the first and second portions and the contact member using the first and second gate stacks as an implantation mask.

18. The method of claim 14, wherein the step of forming a contact member comprises the step of forming a contact member of a carbon nanotube.

* * * * *

UNITED STATES PATENT AND TRADEMARK OFFICE
CERTIFICATE OF CORRECTION

PATENT NO. : 7,989,891 B2  Page 1 of 1
APPLICATION NO. : 11/755930
DATED : August 2, 2011
INVENTOR(S) : Jianhong Zhu et al.

It is certified that error appears in the above-identified patent and that said Letters Patent is hereby corrected as shown below:

In the claim section, Col. 12 lines 59-64 claim 12 should read:

providing a semiconductor layer having a first portion at least partially surrounded by an isolation region, the first portion having a length, and a second portion extending from the first portion and surrounded on three sides by the isolation region, the second portion having a length less than the length of the first portion;

Signed and Sealed this
Twenty-second Day of November, 2011

David J. Kappos
*Director of the United States Patent and Trademark Office*